United States Patent
Banzawa et al.

(10) Patent No.: US 6,179,909 B1
(45) Date of Patent: Jan. 30, 2001

(54) WORK CRYSTAL ORIENTATION ADJUSTING METHOD AND APPARATUS

(75) Inventors: Yoshiaki Banzawa, Kanagawa; Kazunori Onizaki, Saga, both of (JP)

(73) Assignees: Nippei Toyama Corporation, Tokyo; Sumitomo Sitix Corporation, Sagai, both of (JP)

(*) Notice: Under 35 U.S.C. 154(b), the term of this patent shall be extended for 0 days.

(21) Appl. No.: 09/151,701

(22) Filed: Sep. 11, 1998

(30) Foreign Application Priority Data

Sep. 12, 1997 (JP) .................................................. 9-248640

(51) Int. Cl.[7] .................................................. C30B 15/00
(52) U.S. Cl. .................. 117/15; 117/202; 414/745.8; 414/936; 125/16.02; 83/651.1
(58) Field of Search .............................. 117/202, 15, 902; 125/16.02, 35; 414/745.8, 935, 936; 83/409, 409.1, 421, 651.1; 438/973

(56) References Cited

U.S. PATENT DOCUMENTS

| | | | |
|---|---|---|---|
| 5,715,807 | * | 2/1998 | Toyama et al. .................... 125/16.02 |
| 5,857,454 | * | 1/1999 | Shibaoka ............................ 125/16.02 |
| 5,893,308 | * | 4/1999 | Katamachi et al. ....................... 83/13 |
| 5,904,136 | * | 5/1999 | Nagatsuka et al. ................ 125/16.02 |

* cited by examiner

Primary Examiner—Benjamin Utech
Assistant Examiner—Donald L. Champagne
(74) Attorney, Agent, or Firm—Sughrue, Mion, Zinn, Macpeak & Seas, PLLC

(57) ABSTRACT

In the work crystal orientation adjusting method, the crystal orientations of a work 22 in the rotational direction and in the horizontal direction thereof are measured by an orientation measuring device 76. In accordance with the measured value of the crystal orientation of the work 22 in the rotational direction, the work 22 is rotated about the axis thereof to thereby adjust the crystal orientation of the work 22 in the rotational direction. On the outer surface of the work 22, there are put marks M1 and M2 indicating reference positions for adhesion of an auxiliary plate B which is used to cut the work 22. The auxiliary plate B is adhered to the outer peripheral surface of the work 22 based on the marks M1 and M2. A work mounting plate 53 is mounted onto a support base 40 to thereby support the work 22 on the support base 40. Using an orientation adjust mechanism 44 disposed in the support base 40, the center axis 22a of the work 22 is shifted within a horizontal surface to thereby adjust the crystal orientation of the work 22 in the horizontal direction thereof. After then, the support base 40 is mounted onto the work support mechanism 21 to thereby support the work 22 on the work support mechanism 21.

18 Claims, 10 Drawing Sheets

WORK CRYSTAL ORIENTATION ADJUSTING METHOD AND APPARATUS

BACKGROUND OF THE INVENTION

1. Field of the Invention

The present invention relates to a work crystal orientation adjusting method and apparatus, in which, before cutting a work formed of semiconductor material, magnetic material, ceramics or the like hav ing a crystal structure using a wire, the crystal orientation of the work is adjusted.

2. Description of the Prior Art

Generally, in a wire saw, there are disposed a plurality of working rollers at predetermined intervals and, along the respective outer peripheries of these working rollers, there are formed a plurality of annular grooves at a predetermined pitch. Also, between the respective working rollers, a piece of wire is wound sequentially around the annular grooves thereof. Further, a work support mechanism is disposed in correspondence to the wire arranged between the working rollers, while a work is removably mounted on the lower portion of the work support mechanism. And, while the wire is being made to travel, slurry containing float grains is supplied onto the traveling wire and, in this state, the work support mechanism brings the work into pressure contact with the wire to thereby execute a cutting operation or similar operations on the work. By the way, there is also known a wire. saw of a type in which the positions of the wire and work are reversed, that is, turned upside down, while the other remaining portions thereof are quite the same as the above-mentioned type wire saw in structure.

In this type of wire saw, it is necessary that the crystal orientation of the work is previously measured and, based on the measured result, the direction of the work must be adjusted in order for the crystal orientation thereof to be able to correspond to the traveling direction of the wire with a predetermined position relation. For this reason, in the conventional wire saw, the work support mechanism includes an orientation adjust mechanism which is used to adjust the direction of the crystal orientation in the rotational direction of the work and in the horizontal direction.

By the way, in the present patent specification, "to adjust the direction of the crystal orientation" is expressed simply as "to adjust the crystal orientation".

Referring back to the conventional wire saw, after the work is mounted on the work support mechanism, using the orientation adjust mechanism, the work is rotated around the center axis thereof to thereby adjust its crystal orientation in its rotational direction as well as the center axis of the work is shifted in a horizontal plane to thereby adjust the crystal orientation in the horizontal direction.

However, in this conventional adjusting method, the orientation adjust mechanism for adjusting the direction of the work crystal orientation in the rotational direction of the work and in the horizontal direction must be provided in the work support mechanism of the wire saw. This raises a problem that the wire saw is complicated in structure.

Also, in the above-mentioned conventional structure, since it is necessary to adjust the crystal orientation of the work in the rotational direction and in the horizontal direction after the work is mounted on the work support mechanism of the wire saw, the working time including the adjusting time of the work is long as a whole to thereby lowering the working efficiency.

Also, in the conventional wire saw, because the work support mechanism includes only one orientation adjust mechanism, it is impossible that a plurality of works having different crystal orientations are mounted and are cut at the same time while the crystal orientations are matched to one another. In other words, in the conventional wire saw, one work is mounted on one work support tool, the support tool with the work mounted thereon is mounted on the work support mechanism and the work crystal orientation is adjusted, and, after then, the work is cut; that is, whether the work is a short work or a long work, the work can be cut or worked simply one by one. Therefore, the working efficiency of the wire saw is poor and thus the productivity thereof is low.

Also, it can be contrived that a plurality of orientation adjust mechanisms are provided in the work support mechanism and a plurality of works having different crystal orientations are mounted on the work support mechanism and adjusted in their respective crystal orientations by their corresponding orientation adjust mechanisms and, after then, the work can be worked at the same time. However, in this case, the structure of the work support mechanism is extremely complicated and, in addition to this, each work must be adjusted in the crystal orientation in two directions before the cutting of it is started, which lowers the operation efficiency and prolongs the adjusting time, with the result that the productivity of the working operation is not so high.

On the other hand, there is also proposed a structure in which the orientation adjust mechanism is not provided in the work support mechanism but adjust mechanisms for adjusting the crystal orientation in two directions are provided in the work support tool before it is mounted on the work support mechanism. However, in this case as well, the work support tool is complicated in structure and, when a plurality of adjust mechanisms are provided in the work support tool are provided, then the work support tool is further complicated in structure.

SUMMARY OF THE INVENTION

The present invention aims at eliminating the drawbacks found in the above-mentioned conventional work crystal orientation adjusting methods. Accordingly, it is an object of the invention to provide a work crystal orientation adjusting method in which, before a work is mounted on a work support mechanism, the crystal orientation of the work in the rotational direction and in the horizontal direction can be previously adjusted, the structure of a wire saw can be simplified, and the working efficiency can be enhanced. Further, it is also an object of the present invention to provide a work crystal orientation adjusting apparatus in which the above-mentioned method is operatable.

In attaining the above object, according to the present invention, there is a work crystal orientation adjusting method which is conducted before a work to be cut is mounted onto a work support mechanism in a wire saw, the work crystal orientation adjusting method comprising the steps of:

measuring crystal orientations of the work having a crystal structure in a rotational direction and a horizontal direction of the work;

rotating the work around a center axis thereof in accordance with thus measured value of the crystal orientation of the work in the rotational direction so as to adjust the crystal orientation of the work in the rotational direction;

providing marks, which respectively indicates reference positions of the work, on an outer surface of the work thus adjusted in the rotational direction of the work;

adhering auxiliary plate to an outer peripheral surface of the work on which the marks has been provided while the auxiliary plate is positioned relative to the work on the basis of the marks and also is positioned in parallel to the center axis of the work;

mounting the auxiliary plate, on which the work has been adhered, onto an orientation adjust mechanism which is disposed on a support base member being attachable to the work support mechanism in the wire saw;

shifting the center axis of the work in a horizontal plane relative to the support base member in accordance with the measured value of the crystal orientation of the work in the horizontal direction so as to thereby adjust the crystal orientation of the work in the horizontal direction; and, attaching the support base member to the work support mechanism at a predetermined angle after the crystal orientations of the work in the rotational and horizontal directions have been adjusted.

According to the invention, in the above-mentioned work crystal orientation adjusting method, advantageously, the marks indicating the reference positions in the rotational direction are respectively put on the end face of the work and on the outer peripheral surface of the work.

According to the invention, in the above-mentioned work crystal orientation adjusting method, advantageously, the measurement of the work crystal orientations is carried out by an X-ray orientation measuring device.

According to the invention, in the above-mentioned work crystal orientation adjusting method, advantageously, the marks are put while the work is being carried into or out of a crystal orientation measuring position.

According to the invention, in the above-mentioned work crystal orientation adjusting method, advantageously, the marks each consists of two parallel lines spaced apart by a distance corresponding to the width direction of the auxiliary plate.

According to the invention, in the above-mentioned work crystal orientation adjusting method, advantageously, a horizontal-direction crystal orientation of the work on which the auxiliary plate is adhered is adjusted while the work is supported on the support plate.

Further, the above object can also be attained by a work crystal orientation adjusting apparatus for a wire saw with a work support mechanism, according to the present invention, comprising:

means for measuring crystal orientations of a work having a crystal structure in a rotational direction and a horizontal direction of the work;

means for rotating the work around a center axis thereof in accordance with the measured value of the crystal orientation of the work in the rotational direction so as to adjust the crystal orientation of the work in the rotational direction;

means for providing marks, which respectively indicates reference positions of the work, on an outer surface of the work;

means for adhering an auxiliary plate to an outer peripheral surface of the work on which the marks has been provided while the auxiliary plate is positioned relative to the work on the basis of the marks and also is positioned in parallel to the center axis of the work;

an horizontal-direction orientation adjust mechanism, disposed on a support base member being attachable to the work support mechanism in the wire saw, for shifting the center axis of the work in a horizontal plane relative to the support base member in accordance with the measured value of the crystal orientation of the work in the horizontal direction so as to thereby adjust the crystal orientation of the work in the horizontal direction; and, means for attaching the support base to the work support mechanism at a predetermined angle after the crystal orientations of the work in the rotational and horizontal directions have been adjusted.

According to the invention, in the above-mentioned work crystal orientation adjusting apparatus, advantageously, the marks indicating the reference positions in the rotational direction are respectively put on the axially end face of the work and on the outer peripheral surface of the work.

According to the invention, in the above-mentioned work crystal orientation adjusting apparatus, advantageously, the crystal orientations measuring means comprises an X-ray orientation measuring device.

According to the invention, in the above-mentioned work crystal orientation adjusting apparatus, advantageously, the marks each consists of two parallel lines spaced apart by a distance corresponding to the width direction of the auxiliary plate.

According to the invention, in the above-mentioned work crystal orientation adjusting apparatus, advantageously, a plurality of the horizontal-direction orientation adjust mechanisms are disposed on the support base member in such a manner that the plurality of works can be simultaneously cut.

According to the invention, in the above-mentioned work crystal orientation adjusting apparatus, advantageously, the work support mechanism includes a plurality of the support base members each having the horizontal-direction orientation adjust mechanism.

According to the invention, in the above-mentioned work crystal orientation adjusting apparatus, advantageously, the mark providing means comprises:

at least one marker; and means for moving the work between a measuring position of the crystal orientations measuring means and a carry-in/out position which is located outwardly of the measuring position.

According to the invention, in the above-mentioned work crystal orientation adjusting apparatus, advantageously, the mark providing means comprises:

at least one marker;

means for moving the marker; and means for moving the work between a measuring position of the crystal orientations measuring means and a carry-in/out position which is located outwardly of the measuring position.

DETAILED DESCRIPTION OF THE PREFERRED EMBODIMENT

Now, description will be given below of an embodiment of a work crystal orientation adjusting method and apparatus according to the invention with reference to the accompanying drawings.

Figure 1:
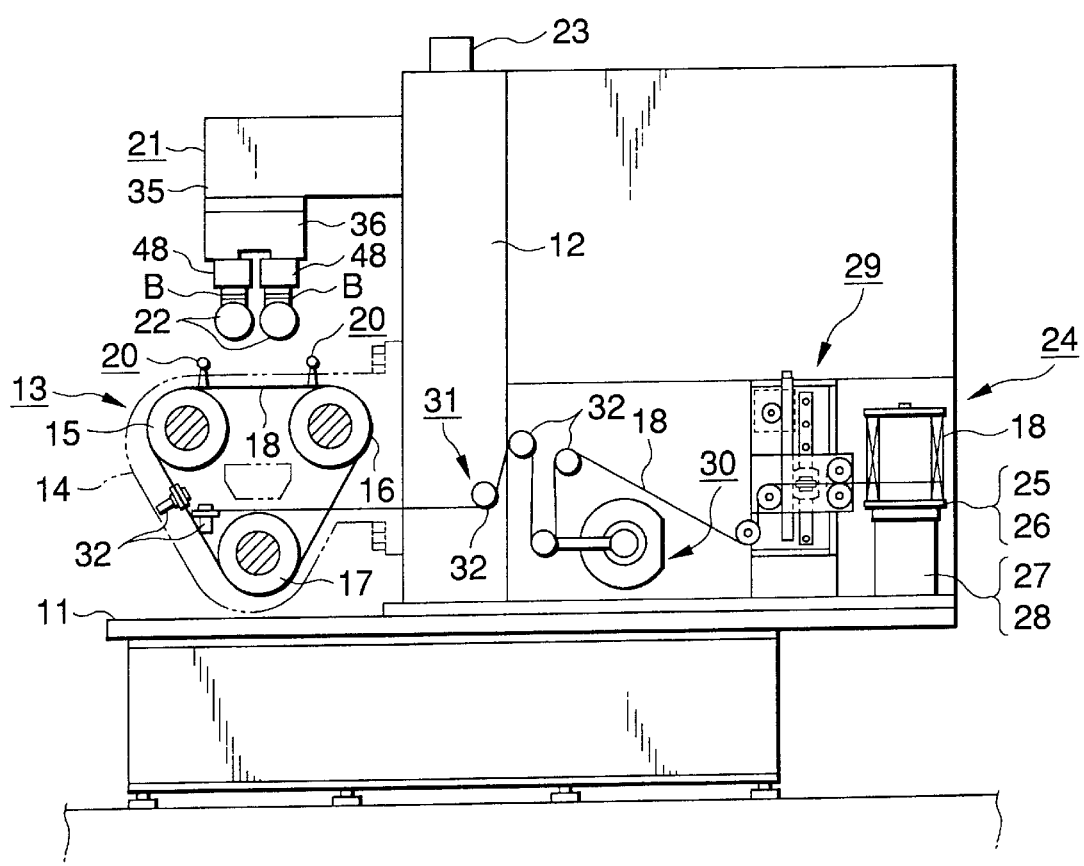
FIG. 1 is a front view of a wire saw, showing an embodiment of a work crystal orientation adjusting method according to the invention.
Figure 2:
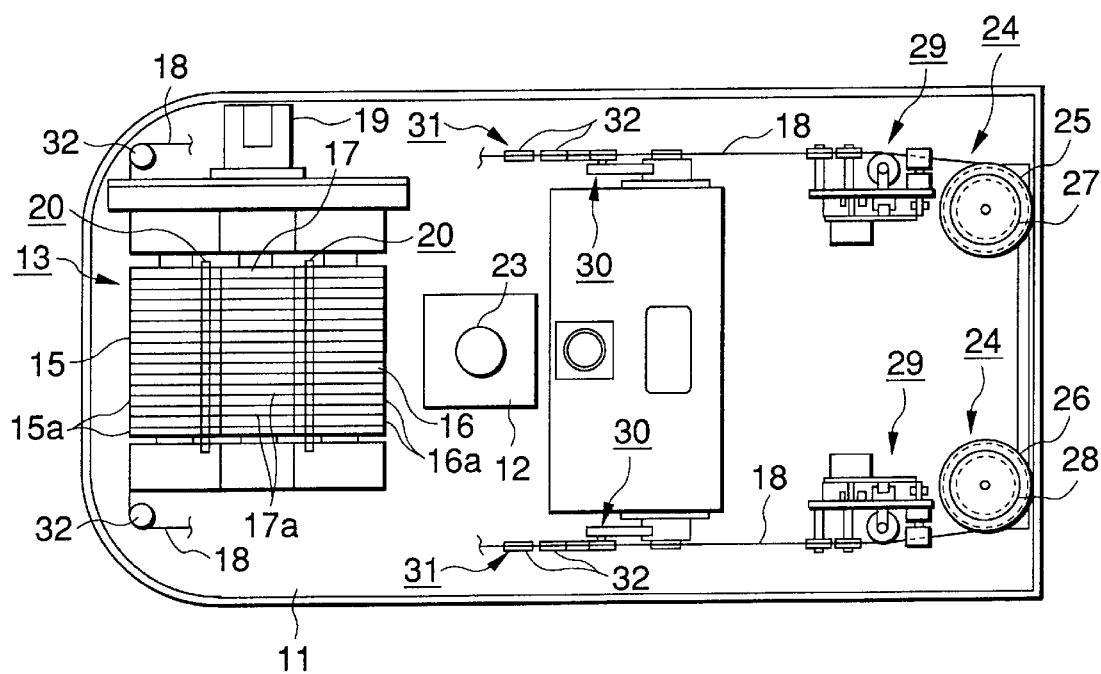
FIG. 2 is a plan view of the above wire saw.

At first, referring to the structure of a wire saw, as shown in FIGS. 1 and 2, a column 12 is erected on a saw base 11. A cutting mechanism 13 is mounted on one side of the column 12 through a bracket 14. The cutting mechanism 13 includes a plurality of working rollers 15, 16, 17 extending in parallel to one another at predetermined intervals, while the working rollers 15, 16, 17 respectively include on their respective outer peripheries annular grooves 15a, 16a, 17a at a predetermined pitch. By the way, in the drawings, for the purpose of easy understanding, the number of the annular grooves 15a, 16a, 17a is drawn smaller than the actual number.

Along the annular grooves 15a, 16a, 17a of the working rollers 15, 16, 17, there is continuously wound a piece of wire 18 which is formed of wire material. A wire running motor 19 is disposed on the bracket 14, while the working rollers 15, 16, 17 can be rotated by the motor 19 through a transmission mechanism (not shown). And, due to the rotation of the working rollers 15, 16, 17, the wire 18 can be run at a predetermined running speed. Referring to the running of the wire 18, the wire alternates advancing a predetermined amount and retreating a predetermined amount repeatedly, and advances gradually as a whole.

A slurry supply mechanism 20 is disposed on the bracket 14 in such a manner that it is located upwardly of the cutting mechanism 13, while the slurry supply mechanism 20 supplies water or oil slurry including float abrasive grains onto the wire 18 wound between the working rollers 15, 16, 17. Upwardly of the slurry supply mechanism 20, a work support mechanism 21 is supported on the column 12 in such a manner that it can be moved in the vertical direction; and, on the lower portion of the work support mechanism 21, there can be removably set a work which is formed of hard and fragile material and has a plurality of crystal structures. On the column 12, there is disposed a work lifting and lowering motor 23, so that the work support mechanism 21 can be moved up and down by the motor 23 through a ball screw (not shown) and the like.

And, in the operation of the thus structured wire saw, while the wire 18 is being run between the working rollers 15, 16, 17 of the cutting mechanism 13, the work support mechanism 21 is moved down toward the cutting mechanism 13. At the then time, the slurry including float abrasive grains is supplied onto the wire 18 from the slurry supply mechanism 20 and, at the same time, the respective works 22 are pressed against and contacted with the wire 18, so that the respective works 22 are simultaneously worked or sliced into wafers due to the lapping operations of the wire 18.

On the saw base 11, there is mounted a reel mechanism 24 which includes a draw-out reel 25 for drawing out the wire 18 and a take-up reel 26 for taking up the wire 18. Also, on the saw base 11, there are disposed a pair of reel rotating motors 27, 28 each consisting of a servo motor which is capable of changing the rotational direction as well as rotation speed thereof, while the reels 25 and 26 are connected to the respective shafts of the servo motors 27 and 28. By the way, after completion of taking-up of the wire 18 around one reel 26, the reel 26 is turned to the wire draw-out side and the other reel 25 is turned to the wire take-up side.

Further, a traverse mechanism 29 is mounted on the saw base 11 in such a manner that it adjoins the reel mechanism 24; and, the traverse mechanism 29, while traversing vertically, guides the wire 18 in order that the wire 18 can be drawn out from the draw-out reel 25 and the wire 18 can be taken up around the take-up reel 26. Due to the rotational movements of the two reels 25 and 26 of the reel mechanism 24, the wire 18 is drawn out from the drawn-out reel 25 to the cutting mechanism 13 and, at the same time, the wire 18, which has finished its working operation, is taken up around the take-up reel 26.

Between the reel mechanism 24 and cutting mechanism 13, there are interposed a tension applying mechanism 30 and a guide mechanism 31. And, the two ends of the wire 18 wound between the working rollers 15, 16, 17 of the cutting mechanism 13 are mounted on the tension applying mechanism 30 through guide rollers 32 which are provided in the guide mechanism 31. In this state, a predetermined tension can be applied to the wire 18 wound between the working rollers 15, 16, 17 by the tension applying mechanism 30.

Next, description will be given below of a method for adjusting the crystal orientations of the work 22 before the work 22 is mounted onto the work support mechanism 21.

Figure 3:
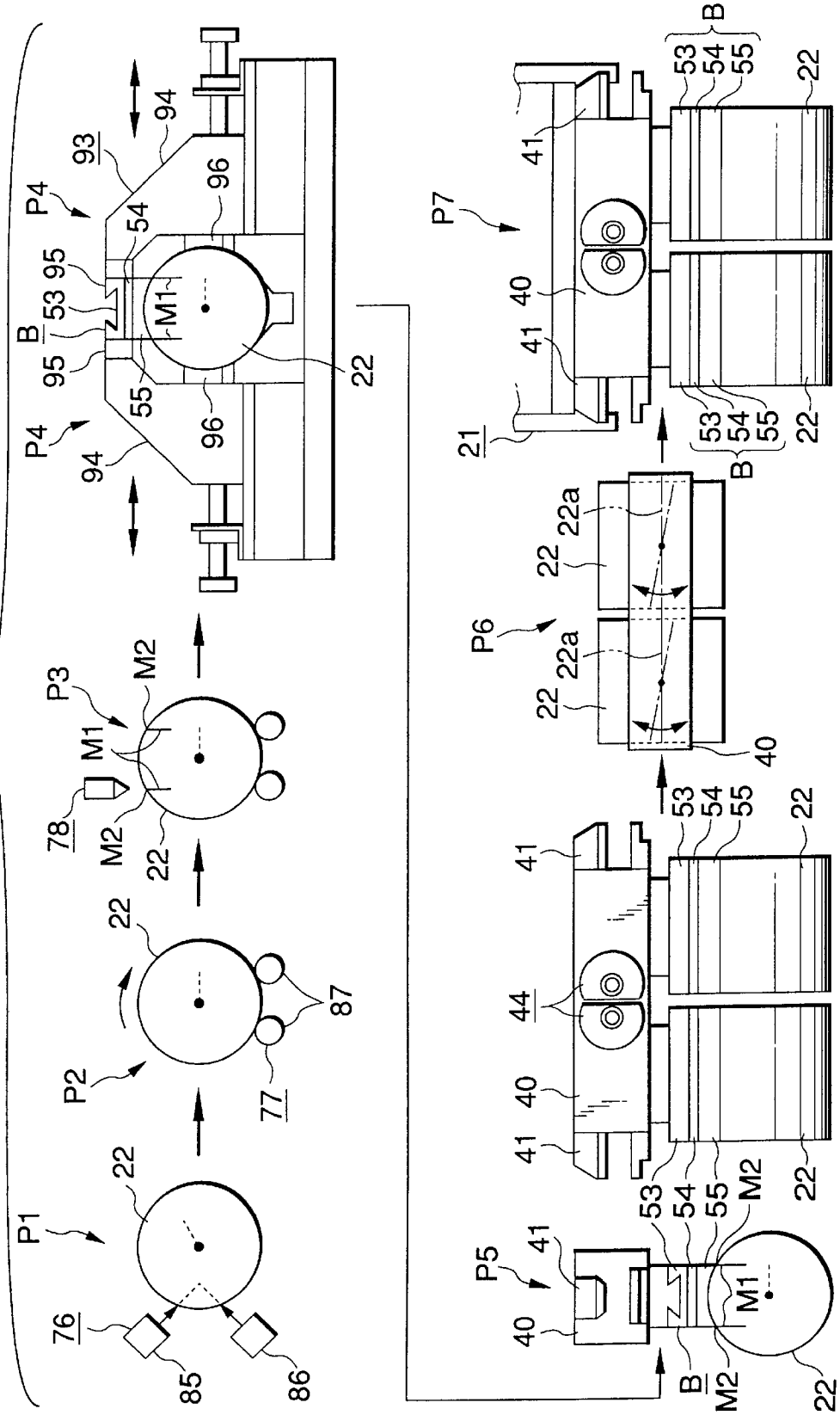
FIG. 3 is an explanatory view to show sequentially the work crystal orientation adjusting method.

In particular, in the work crystal orientation adjusting method according to this embodiment, as shown in FIG. 3, in a first step P1, the crystal orientations of the work 22 in the rotational direction and in the horizontal direction thereof are measured by an X-ray orientation measuring device 76. In a second step P2, in accordance with the measured value of the crystal orientation in the rotational direction, an orientation adjust device 77 rotates the work 22 around the axis thereof to thereby adjust the crystal orientation of the work 22 in the rotational direction.

In a third step P3, with the crystal orientation of the work 22 in the rotational direction adjusted, a marking device 78 puts marks M1 and M2 on the outer surface of the work 22 to respectively indicate reference positions 22 in the rotational direction which are used to adhere an auxiliary plate B for cutting the work 22. In this case, as the mark M2, there are marked on the outer peripheral surface of the work 22 two parallel lines which are spaced from each other at a distance corresponding to the width of the auxiliary plate B and extend in parallel to the axis of the work 22. Also, as the mark M1, there are marked on the end face of the work 22 two short lines which respectively continue with the mark M2. The auxiliary plate B is composed of, for example, a work mounting plate 53, a glass plate 54, a carbon plate 55 and the like which are respectively equal in width to one another.

In a fourth step P4, with the marks M1 and M2 as the reference positions, the auxiliary plate B is adhered on the outer peripheral surface of the work 22 while being confronted with the latter in such a manner that it extends in parallel to the axis of the work 22. In a fifth step P5, the auxiliary plate B is mounted on an orientation adjust mechanism 44 provided in a support base 40 to thereby support the work 22 on the support base 40.

In a sixth step P6, the orientation adjust mechanism 44 is allowed to shift the axis of the work 22 within a horizontal surface with respect to the support base 40 in accordance with the measured value of the crystal orientation in the horizontal direction thereof to thereby adjust the crystal orientation of the work 22 in the horizontal direction thereof. And, in a seventh step P7, the support base 40 is mounted on the work support mechanism 21 of the wire saw at a predetermined angle to thereby support the work 22 on the work support mechanism 21.

Figure 4:
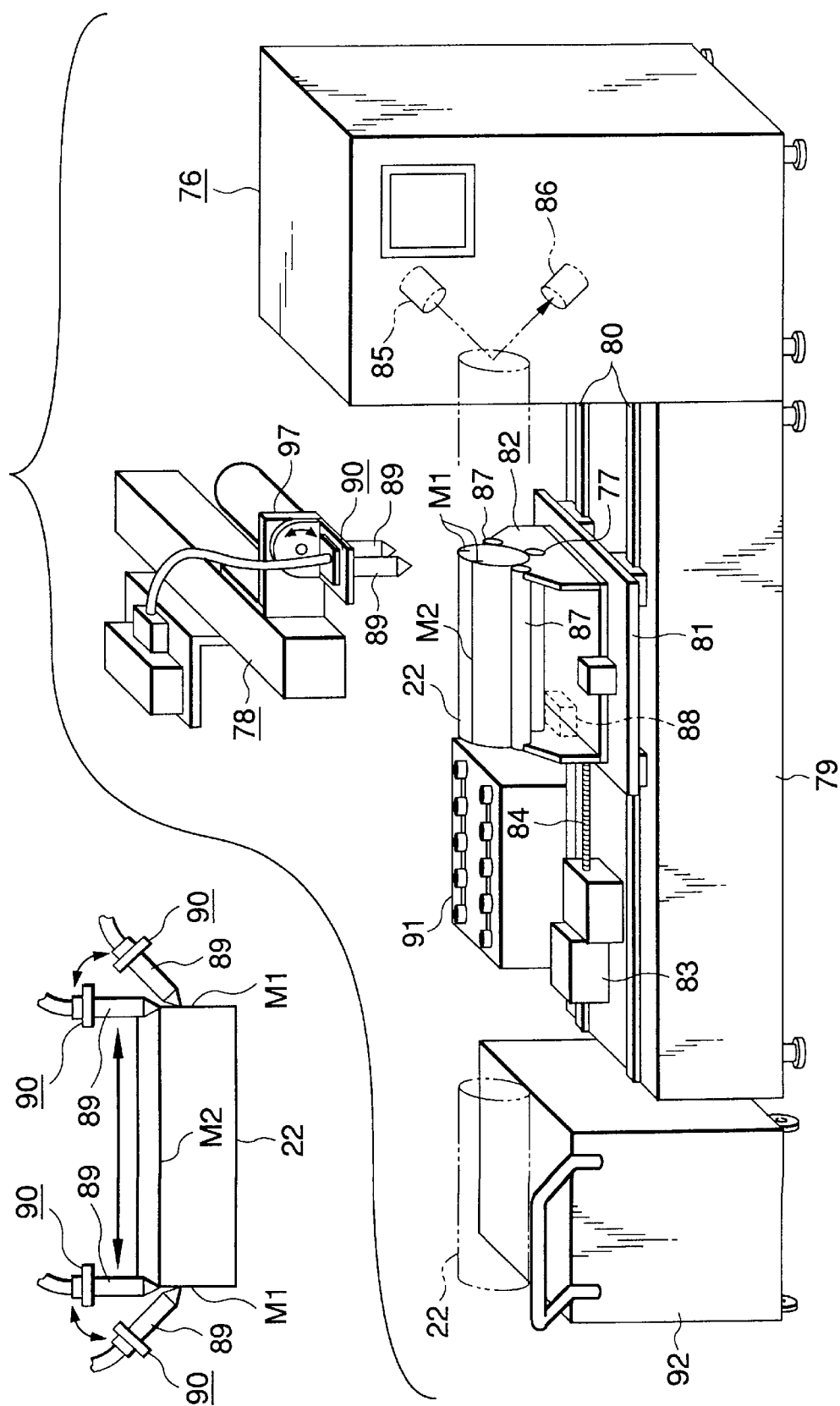
FIG. 4(a) is a perspective view of a structure related to a work crystal orientation measuring device.
FIG. 4(b) is an explanatory view of the operation of a marking head.

Now, referring in more detail to the above-mentioned respective devices, as shown in FIG. 4(a), on the side of the X-ray orientation measuring device 76, there is disposed a base 79; and, on the upper surface of the base 79, there are supported a moving plate 81 through a pair of rails 80 in such a manner that it can be moved. On the moving plate 81, there is disposed a support base 82 and, on the upper surface of the support base 82, there is supported the work 22 while the axis of the work 22 is being kept in a horizontal plane through the orientation adjust device 77. On the base 79, there is also disposed a moving motor 83, so that the moving plate 81 can be moved by the motor 83 through a ball screw 84. The motor 83, ball screw 84 and moving plate 81 cooperate together in forming work moving means. By the work moving means, the work 22 on the support base 82 can be moved to and set at not only the measuring position of the X-ray orientation measuring device 76 but also at a carry-in/out position which is located outwardly, of the measuring position of the X-ray orientation measuring device 76.

The X-ray orientation measuring device 76 includes a rotary illumination head 85 and a measuring device 86 which, when the work 22 is moved to and set at the measuring position, can be disposed opposed to the end face of the work 22. And, the X-ray orientation measuring device 76 rotates the illumination head 85 by a predetermined angle each time to illuminate X rays onto a plurality of positions on the end face of the work 22 from the illumination head 85, receives the reflected light rays and, based on the wavelengths, intensities and the like of the X rays produced from the work 22, measures the crystal orientations of the work 22 in the rotational direction and in the horizontal direction thereof by the measuring device 86.

The orientation adjust device 77 includes a plurality of rotary support rollers 87 for supporting the work 22 while the axis of the work 22 is being kept in a horizontal plane, and a rotating motor 88 for rotating these rollers 87. And, after the crystal orientations of the work 22 are measured, on the way to moving the work 22 from the measuring position to the carry-in/out position, or at a predetermined position, the rotary support rollers 87 are rotated by the rotating motor 88 and the work 22 is rotated around the axis thereof in accordance with the measured value of the crystal orientation of the work 22 in the rotational direction, thereby adjusting the crystal orientation of the work 22 in the rotational direction.

The marking device 78 includes a marking head 90 in the rear of the base 79 through a oscillating mechanism 97. The marking head 90 is disposed opposed to the work 22 which is moved and positioned outwardly of the X-ray orientation measuring device 76. Also, the marking head 90 includes two markers 89, while the distance between the two markers 89 can be. freely adjusted and is adjusted to the width dimension of the work mounting plate 53 to be adhered. And, as shown in FIG. 4(b), after the crystal orientation of the work 22 in the rotational direction is adjusted, due to the movement of the work 22 in the carrying direction thereof as well as the oscillating movements of the marking heads 90 driven by the oscillating mechanism 97, the two marks M1 and M2 each consisting of two lines are continuously put on the end face and outer peripheral surface of the work 22. That is, the oscillating motion of the marking heads 90 can be executed in synchronization with the rotation of the motor 83 in accordance with the data on the length and position of the work to be cut.

Further, on the base 79, there is mounted a conveyor 91 in such a manner that it can be opposed to the work 22 moved to and set at the carry-in/out position. And, on the side of the base 79, there is disposed a cart 92 which is used to carry the work 22 to the side position of the base 79. That is, after the work 22 is carried through the conveyor 91 onto the support base 82 and is then marked,by the marking heads, the work 22 is carried through the conveyor 91 onto the cart 92. Then, the work 22 is delivered to an adhering mechanism; that is, the work mounting plate 53 is adhered to the work 22 in the next step by the adhering mechanism.

Next, description will be given below in detail of the structure for mounting the auxiliary plate B onto the work 22, the structure for mounting the support base 40 onto the auxiliary plate B, the structure of the orientation adjust mechanism 44, and the structure for mounting the support base 40 onto the work support mechanism 21 of the wire saw with reference to FIGS. 3, 5 and 6. By the way, the work mounting plate 53, carbon plate 55 and glass plate 54, which cooperate together in forming the auxiliary plate B, are previously adhered and fixed together in an integrally united body.

The work 22 is positioned in the rotational direction thereof with respect to the work mounting plate 53 carried in from above the work 22 in such a manner that the marks M1 and M2 of the work 22 are matched to the two end edges of the work mounting plate 53 in the width direction thereof, and the work 22 is thus placed on a V block. And, in this state, the auxiliary plate B is connected onto the work 22 through an adhesive applied to the lower surface of the carbon plate 55. Next, two saddles 94 provided on a fixing jig 93 are moved in their mutually approaching direction, and parallel chuck pieces 95, 96 provided in the upper and lower portions of the two saddles 94 are allowed to hold the outside diameter of the work 22 and the two side surfaces of the work mounting plate 53 in the width direction thereof, thereby correcting them into their mutually parallel state. The work 22 with the auxiliary plate B adhered thereto in this manner is then mounted onto the support base 40. The support base 40, according to the present embodiment, is structured such that it is capable of mounting two works 22 thereon.

Each support base 40 includes on the two sides thereof an engaging piece 41 of an almost inverted trapezoidal section serving as a mounting reference thereof onto the work support mechanism 21 and a projecting piece 74 to be placed on a delivery cart (not shown) or the like. Also, in each support base 40, there are mounted a pair of orientation adjust mechanisms 44, while two works 22 can be individually supported on the lower portions of the two orientation adjust mechanisms 44.

Figure 8:
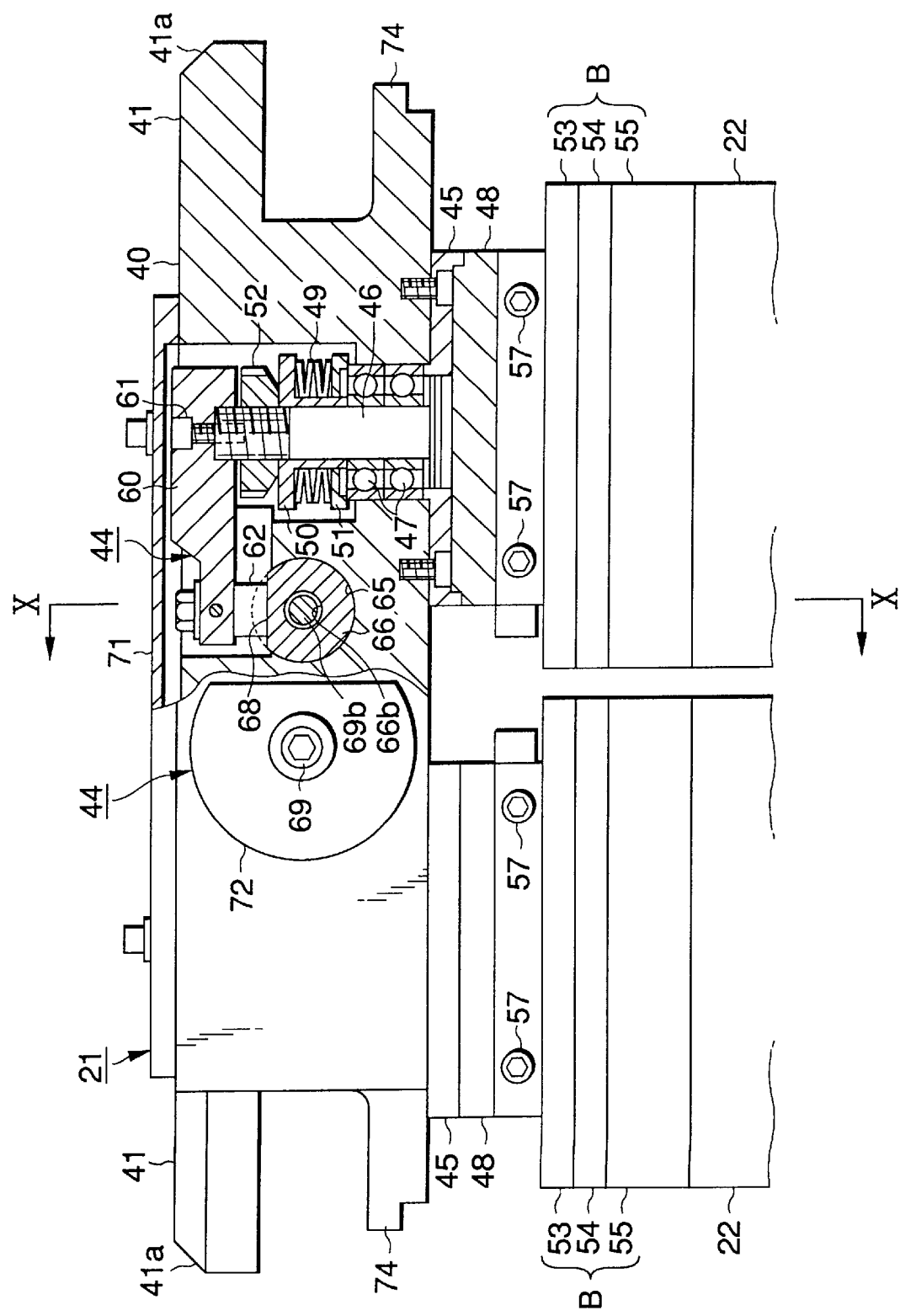
FIG. 8 is a broken side view of the main portions of the structure shown in FIG. 6, showing a support base in a further enlarged manner.
Figure 9:
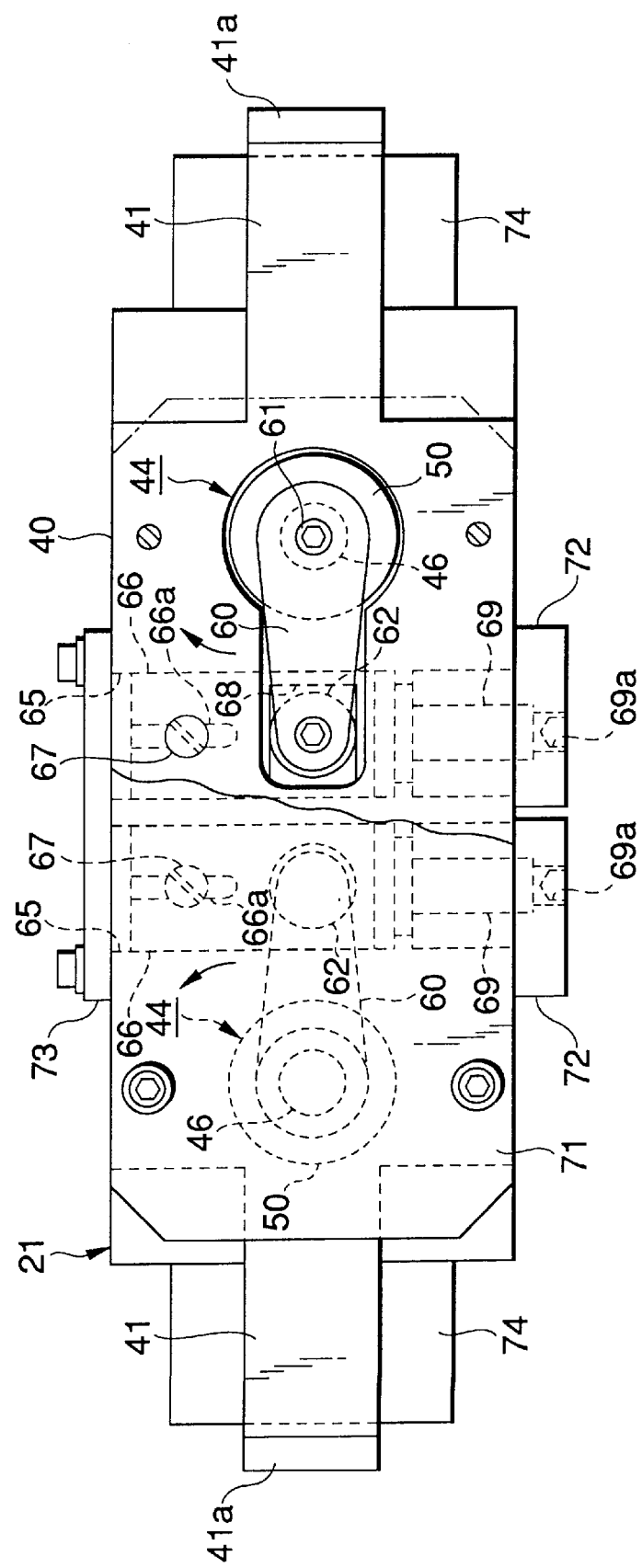
FIG. 9 is a broken plan view of the main portions of the support base shown in FIG. 8; and, FIG. 10 is a section view taken along the line X—X shown in FIG. 8.
Figure 10:
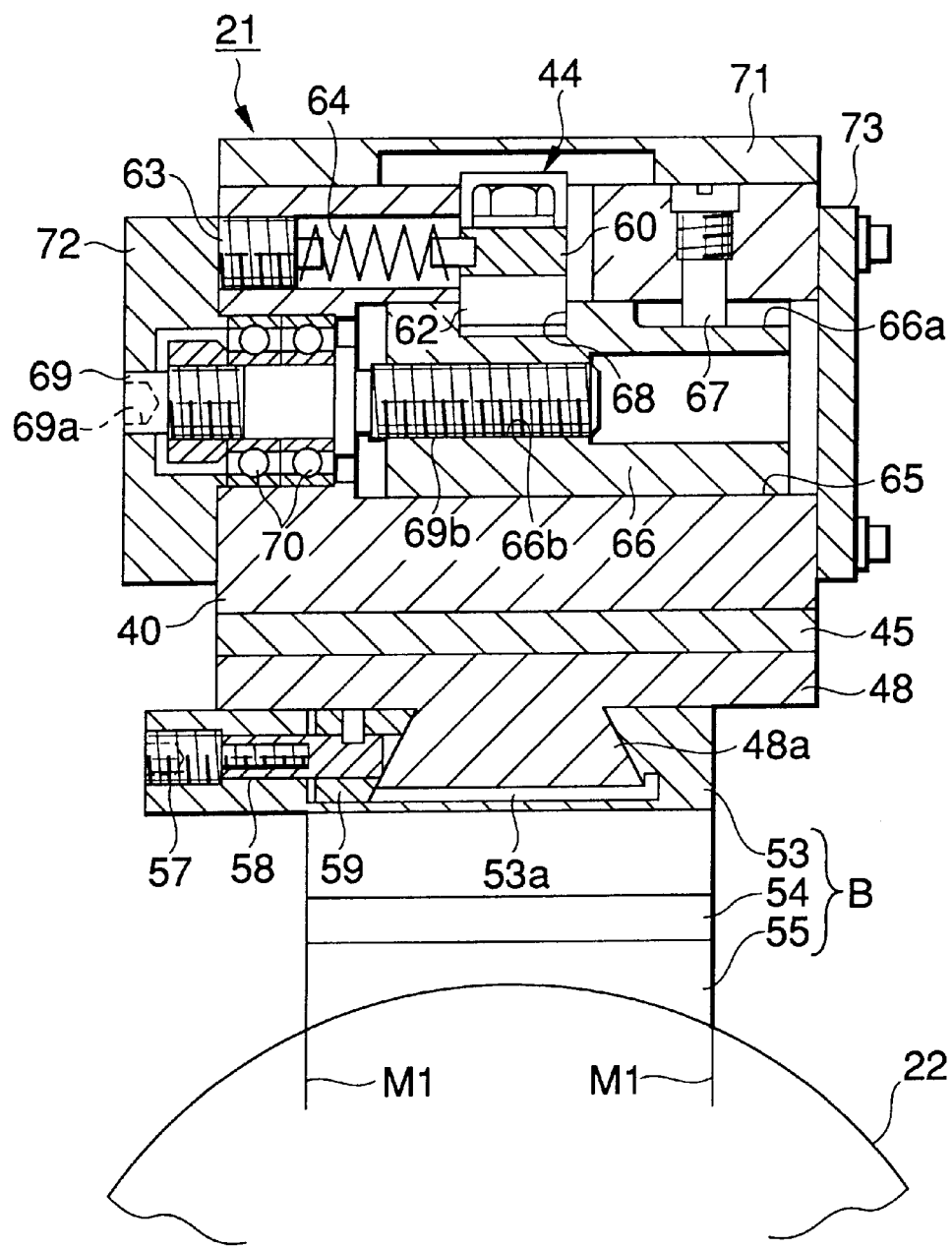

Referring now in detail to the orientation adjust mechanisms 44, as shown in FIGS. 8 to 10, a pair of connecting plates 45 are mounted onto the lower surface of each of the support bases 40. In the support base 40, there are rotatably supported a pair of rotary shafts 46 through bearings 47 in such a manner that they extend through the respective connecting plates 45. A work support body 48 is fixed to the lower end of each of the rotary shafts 46, while a dovetail portion 48a for sliding guidance is formed on the lower surface of the work support body 48 in such a manner that it is extended almost in the same direction as the longitudinal direction of the engaging piece 41.

On the outer periphery of the rotary shaft 46, there are mounted a plurality of countersunk springs 49 through a pair of spring receivers 50 and 51, while the countersunk springs 49 are prevented against removal by a nut 52. And, the rotary shaft 46 is energized upwardly by the countersunk springs 49 to thereby press the work support body 48 against the connecting body 45. Due to this, the work support body 48 can be held at a predetermined rotation adjusting position.

On the lower surface of each of the work support bodies 48, there is mounted the work mounting plate 53 through engagement of the dovetail groove 53a of the work mounting plate 53 with the dovetail portion 48a of the work support body 48 in such a manner that the work mounting plate 53 can be moved along the dovetail groove 48a and can be removed from the work support body 48.

A fastening screw 57 is threadedly engaged with the outside portion of the work mounting plate 53 in such a manner that it corresponds to the dovetail portion 48a of the work support body 48 and, inside the fastening screw 57, there are movably disposed a moving pin 58 and a clamp body 59. And, if the fastening screw 57 is threadedly advanced, the clamp body 59 is pressed against the dovetail portion 48a of the work support body 48 through the moving pin 58, so that the work mounting plate 53 can be fixed to the work support body 48 located on the lower portion of the support base 40.

As shown in FIGS. 8 to 10, to the upper end of each of the rotary shafts 46, there is fixed a rotary lever 60 serving as a rotary member by a screw 61 and, on the lower surface of the leading end of the rotary lever 60, there is rotatably supported an engaging roller 62. Between the spring receiver 63 in threaded engagement with the support base 40 and its associated rotary lever 60, there is interposed a spring 64, whereby the rotary lever 60 is rotationally energized in a direction of an arrow shown in FIG. 9 by its associated spring 64.

In the support base 40, there are formed a pair of storage holes 65 in such a manner that they respectively correspond to the rotary levers 60. In each storage hole 65, there is movably stored a cylindrical-shaped moving body 66; while, in the outer peripheral surface of the moving body 66, there is formed an engaging groove 66a and, in the central portion of the moving body 66, there is formed a screw hole 66b. And, a pair of rotation preventive pins 67 are threadedly engaged with the support base 40 and, through engagement of the leading ends of the pins 67 with the engaging grooves 66a of the moving bodies 66, the rotational movements of the moving bodies 66 are respectively restricted. The respective moving bodies 66 include engaging grooves formed on their outer surfaces, while the engaging rollers 62 on the rotary levers 60 are respectively engaged into the engaging grooves of the moving bodies 66.

In each of the storage holes 65 of the support base 40, there is rotatably supported an adjusting shaft 69 serving as an adjusting member through bearings 70 in such a manner that it corresponds to its associated one of the moving bodies 66. Also, each of the adjusting shafts 69 includes a tool engaging hole 69a formed in the outer end thereof and a screw portion 69b which is formed in the inner end thereof and is threadedly engageable with the screw hole 66b of its associated moving body 66.

And, when the adjusting shaft 69 is rotated and adjusted by bringing a tool (not shown) into engagement with the tool engaging hole 69a, the moving body 66 is moved through the screw portion 69b and screw hole 66b, while the rotary lever 60 is rotated through the engaging groove 68 and engaging roller 62. Due to this, the work support body 48 is rotated through the rotary shaft 46 and the center axis 22a of the work 22 mounted to the lower surface of the work mounting plate 53 is rotated and shifted within a horizontal surface, so that the crystal orientation of the work 22 in the horizontal direction thereof can be adjusted.

And, the center axes 22a of the respective works 22 are rotated and shifted within a horizontal surface with respect to the support base 40 in accordance with the measured values of the crystal orientations of the works 22 in the horizontal direction thereof by these orientation adjust mechanisms 44, so that the crystal orientations of the works 22 in the horizontal direction thereof can be adjusted to be parallel to a mounting reference line or the longitudinal direction of the engaging piece 41. By the way, an upper cover 71 is mounted on the upper surface of the support base 40, so that the top portions of the respective rotary levers 60 are covered by the upper cover 71. Also, a pair of flange plates 72 are mounted on the front surface of the support base 40, so that the front portions of the respective storage holes 65 are covered while the front ends of the adjusting shafts 69 are exposed. Further, a rear cover 73 is mounted on the rear surface of the support base 40 to thereby cover the rear portions of the respective storage holes 65. In this state, the support base 40 is mounted onto the work support mechanism 21 of the wire saw. In the present embodiment, the work support mechanism 21 is structured such that it is capable of receiving two support bases 40.

Figure 5:
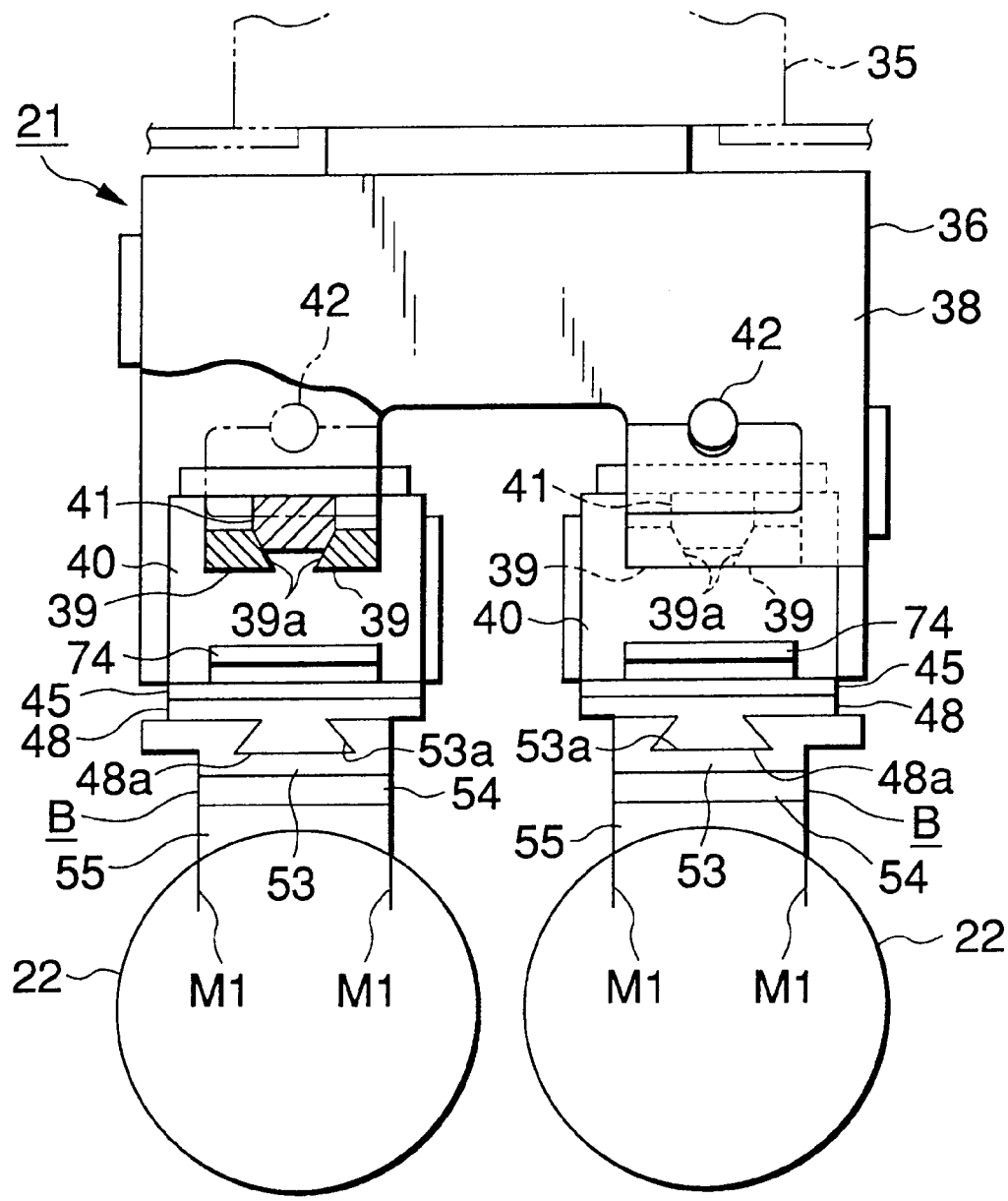
FIG. 5 is a partially enlarged front view of a work mounting structure, showing how to mount a work onto a work support mechanism.
Figure 6:
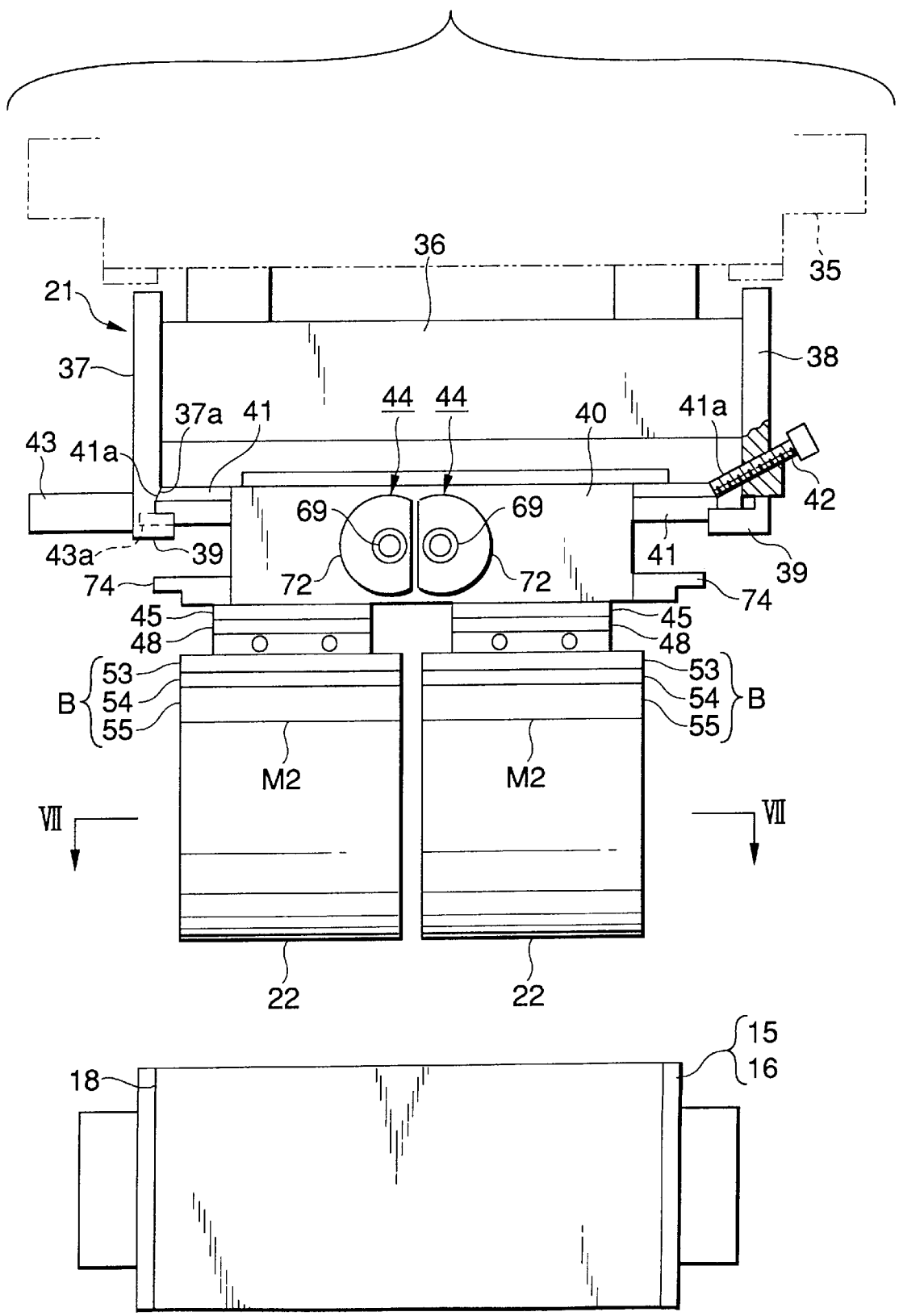
FIG. 6 is a broken side view of the main portions of the structure shown in FIG. 5, showing how to mount the work.

As shown in FIGS. 5 and 6, a lifting base 35 is supported on the side portion of the column 12 of the wire saw in a liftable and lowerable manner, while a clamp base 36 is disposed on the lower surface of the lifting base 35. And, a pair of clamp plates 37 and 38 are respectively mounted on the two side portions of the clamp base 36, while one clamp plate 37 includes an inclined engaging surface 37a formed in the lower end inner edge thereof. At the mutually opposed positions of the pair of clamp plates 37 and 38, on the lower end inner surfaces of the respective clamp plates 37 and 38, two pairs of support projections 39 are provided at a predetermined interval in the two portions of the present lower end inner surfaces, that is, each pair at each portion; and, in the mutually opposed surfaces of the two pairs of support projections 39, there are formed inclined support surfaces 39a in such a manner that they form almost a V shape.

Between the two clamp plates 37 and 38, the support bases 40 are respectively clamp supported by and between the two pairs of support projections 39. That is, here, the present structure is capable of mounting two support bases 40. In particular, the engaging pieces 41 on the two sides of the respective support bases 40 are engaged with and supported on the inclined support surfaces 39a of the two pairs of support projections 39. And, the respective engaging pieces 41 include inclined surfaces 41a which are respectively formed on the upper edges of the leading ends of the engaging pieces 41.

A pair of clamp screws 42 are threadedly engaged with the clamp plate 38 in correspondence to the respective support bases 40; and, if the clamp screws 42 are threadedly advanced, then the leading ends of the clamp screws 42 are contacted with the inclined surface 41a of one engaging piece 41. Following this contact, the support base 40 is moved in the left direction in FIG. 6, so that the inclined surface 41a of the other engaging piece 41 is brought into wedge engagement with the inclined engaging surface 37a of the clamp plate 37. Due to this, the pair of support bases 40 can be positively clamped at predetermined positions on the support projections 39 between the two clamp plates 37 and 38. As a result of this, the respective support bases 40 can be positioned at predetermined angular positions so that the mounting reference line coincides with a direction intersecting at right angles to the running direction of the wire 18.

Figure 7:
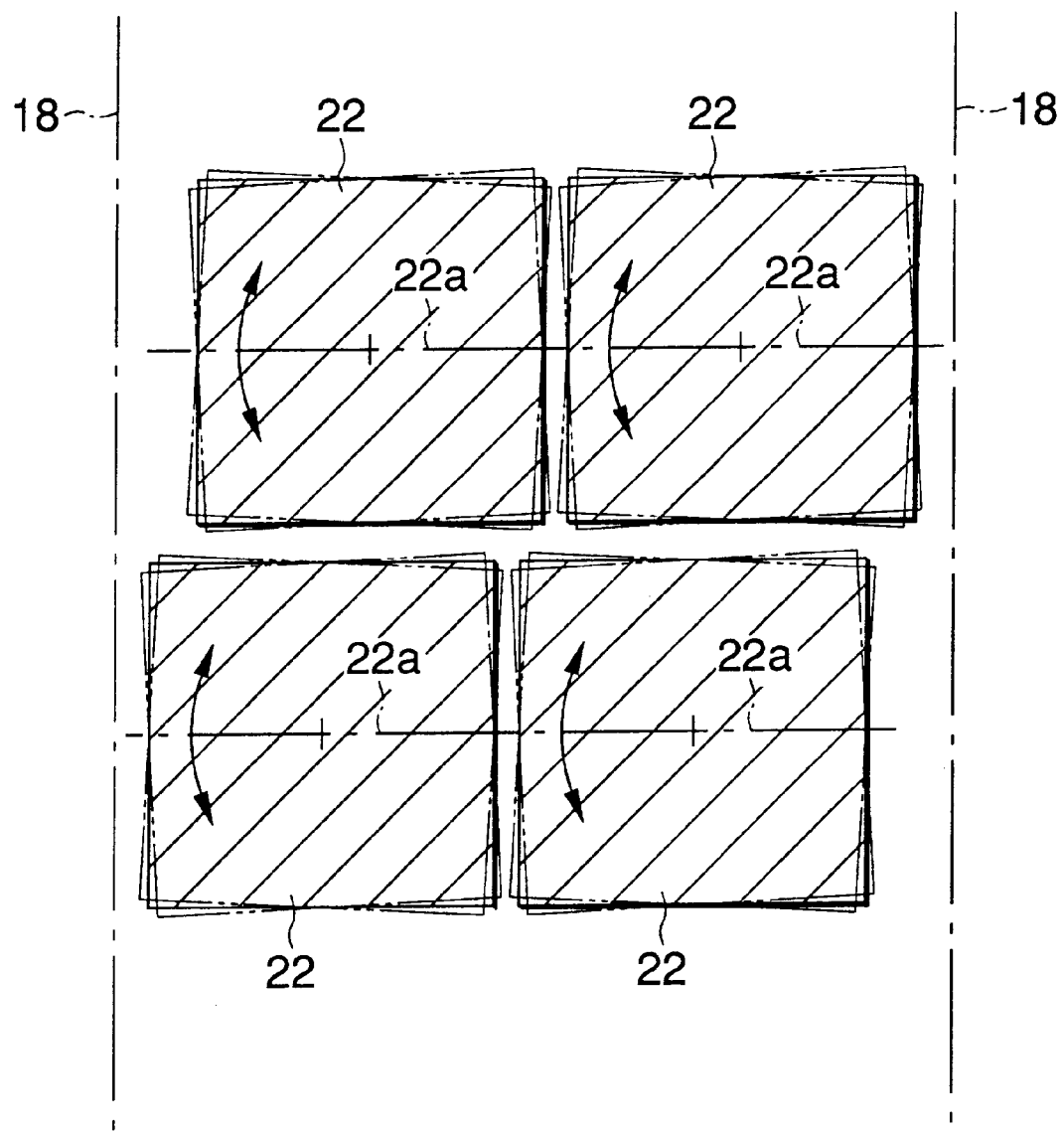
FIG. 7 is a section view taken along the line VII—VII shown in FIG. 6.

On the outer surface of the clamp plate 37, there is disposed a cylinder 43 for return in such a manner that the leading end of the piston rod 43a of the cylinder 43 is disposed opposed to the other engaging piece 41. And, with the clamp screws 42 threadedly retreated, if the return cylinder 43 is operated or projected, then the support base 40 is moved to the right in FIG. 6, thereby removing the engagement between the inclined surface 41a of the engaging piece 41 and the inclined engaging surface 37a of the clamp plate 37. This makes it possible to remove the support base 40 from the support projections 39 between the two clamp plates 37 and 38. In a state where the two support bases 40 are mounted on the work support mechanism 21, as shown in FIGS. 5 to 7, the works 22 are disposed in the following manner: that is, there are arranged two lines of works at a predetermined interval in the running direction of the wire 18 between the working rollers 15, 16, 17, and two works are arranged in each line at a predetermined interval; namely, a total of four works are arranged with the crystal orientations thereof adjusted.

Next, description will be given below of an operation in which the crystal orientations of the work 22 are adjusted and the thus adjusted work 22 is mounted on the work support mechanism 21.

Now, prior to mounting of the work 22 onto the work support mechanism 21, as shown in FIGS. 3 and 4(a), (b), the crystal orientations of the work 22 in the rotational direction and in the horizontal direction thereof are measured by the X-ray orientation measuring device 76. After then, the work 22 is rotated about the axis thereof by the orientation adjust device 77 in accordance with the measured value of the crystal orientation of the work 22 in the rotational direction thereof, so that the crystal orientation of the work 22 in the rotational direction thereof is adjusted. In this state, the marks M1 and M2 each consisting of two parallel lines are respectively put on the end face of the work 22 as well as on the outer peripheral surface of the work 22 by the marking device 78.

After then, based on the marks M1 and M2, the auxiliary plate B, namely, the work mounting plate 53 is adhered and fixed to the outer peripheral surface of the work 22 through the carbon plate 55 and glass plate 54. Further, the work mounting plate 53 is mounted onto the lower surface of the support base 40, so that the work 22 can be supported on the support base 40. In this case, as shown in FIG. 10, if a pair of work mounting plates 53 are supported on the respective work support bodies 48 located in the lower portion of the support base 40 due to engagement between the dovetail grooves 53a and dovetail portions 48a and are then fastened and fixed to their respective predetermined positions by the screws 57, then the two works 22 can be arranged and supported coaxially on the lower surface of the support base 40.

In this state, if, in the orientation adjust mechanisms 44 corresponding to their respective works 22, tools (not shown) are engaged with the tool engaging holes 69a of the adjusting shafts 69 thereof to thereby rotate and adjust the adjusting shafts 69, then the moving bodies 69 are respectively moved through the screw portions 69b and screw holes 66b, so that the rotary levers 60 are respectively rotated through the engaging grooves 68 and engaging rollers 62. As a result of this, the work support bodies 48 are respectively rotated through the rotary shafts 46 and the center axes 22a of the works 22 respectively mounted on the lower surface of the auxiliary plates B are respectively rotated and shifted within a horizontal surface, so that the crystal orientations of the works 22 in the horizontal direction thereof can be adjusted.

After then, the pair of support bases 40 are supported on the support projections 39 between the two clamp plates 37 and 38 of the clamp base 36 in the work support mechanism 21 of the wire saw, and the two clamp screws 42 are tightened. As a result of this, a plurality of works 22 can be arranged in the lower portion of the work support mechanism 21 in two lines at a predetermined interval in the running direction of the wire 18, two works 22 in each line.

Therefore in this state, if the operation of the wire saw is started, then the wire 18 is drawn out from the draw-out reel 25 of the reel mechanism 24. Then, the wire 18 is advanced gradually in an alternately forward and backward running manner, before it is taken up around the take-up reel 26. And, while the slurry containing the float abrasive grains are being supplied onto the wire 18 between the working rollers 15, 16, 17 by the slurry supply mechanism 20, the work support mechanism 21 is moved down to thereby press the plurality of the works 22 against the wire 18. Due to this, the respective works 22 can be simultaneously cut or machined into a predetermined thickness.

Now, description will be given below of the effects that can be expected by the above-mentioned embodiment.

Firstly, in the work crystal orientation adjusting method according to the present embodiment, prior to mounting of the work 22 onto the work support mechanism 21, the crystal orientations of the work 22 in the rotational direction and in the horizontal direction thereof are measured by the X-ray orientation measuring device 76. Then, the work 22 is rotated about the axis thereof in accordance with the measured value of the crystal orientation of the work 22 in the rotational direction to thereby adjust the crystal orientation of the work 22 in the rotational direction. In this state, the marks M1 and M2 serving as the reference for the adhering position of the auxiliary plate B are put on the outer surface of the work 22. Based on the mark M1, the work mounting plate 53 is adhered,on the outer peripheral surface of the work 22 through the carbon plate 55 in such a manner that the work mounting plate 53 extends in parallel to the axis 22a of the work 22. The work mounting plate 53 is mounted onto the support base 40 to thereby support the work 22 on the support base 40. In this state, using the orientation adjust mechanism 44 provided in the support base 40, the axis 22a of the work 22 is shifted within a horizontal surface to thereby adjust the crystal orientation of the work 22 in the horizontal direction thereof in accordance with the measured value of the crystal orientation of the work 22 in the horizontal direction. After then, the support base 40 is mounted on the work support mechanism 21 to thereby support the work 22 on the work support mechanism 21.

Thanks to this, prior to mounting of the work 22 onto the work support mechanism 21, the crystal orientations of the work 22 in the rotational direction and in the horizontal direction thereof can be previously adjusted. Therefore, it is not necessary to provide an orientation adjust mechanism in the work support mechanism 21 of the wire saw which is used to adjust the crystal orientations of the work 22 in the rotational direction and in the horizontal direction, thereby being able to simplify the structure of the wire saw. Also, since the work 22 is supported on the support base 40 in such a manner that the crystal orientations of the work 22 in the rotational direction and in the horizontal direction have been adjusted, after mounting of the work 22 onto the work support mechanism 21, the working of the work 22 can be started at once, which makes it possible to enhance the working efficiency.

Further, because it is not necessary to adjust the crystal orientations of the work 22 after the work 22 is mounted onto the work support mechanism 21, a plurality of works 22 having different crystal orientations can be supported on the work support mechanism 21 and these works 22 can be worked at the same time with high efficiency. Also, due to the fact that, after the crystal orientations of the work 22 are measured, the marks M1 and M2 are put on the outer surface of the work 22 based on the measured values thereof, even when the step of adhering the auxiliary plate B including the carbon plate 55, work mounting plate 53 and the like is executed at a position far from the step of adjusting the crystal orientation of the work 22 in the rotational direction thereof, the auxiliary plate B can be adhered accurately to the predetermined position of the outer peripheral surface of the work 22.

Secondly, in the work crystal orientation adjusting method according to the present embodiment, the mark M1 is put on the end face of the work 22, while the mark M2 is put on the outer peripheral surface of the work 22. Thanks to this, even if an operator is present on the end face side of the work 22 or on the outer peripheral surface side of the work 2, the operator is able to confirm the mounting position of the work mounting plate 53 with ease, which makes it possible to enhance the operation efficiency.

Thirdly, in the work crystal orientation adjusting method according to the present embodiment, the measurement of the crystal orientations of the work 22 is carried out by the X-ray orientation measuring device 76. Due to this, the crystal orientations of the work 22 in the rotational direction and in the horizontal direction thereof can be measured easily and accurately by the X-ray orientation measuring device 76.

By the way, the present invention can also be changed and embodied in the following manner:

That is, in the structure for clamping the support base 40 between the clamp plates 37 and 38 of the clamp base 36 in the work support mechanism 21, instead of the clamp screw 42 used in the above-mentioned embodiment, a cylinder for clamping can be used.

The support structure for supporting the support base 40 on the clamp base 36, and the structure for mounting the work mounting plate 53 on the work support body 48 located in the lower portion of the support base 40 can be changed properly.

The structure of the auxiliary plate B can be changed properly: that is, the glass plate 54 can be excluded from the auxiliary plate B; the carbon plate 55 is excluded from the auxiliary plate B, but the carbon plate 55 portion of the auxiliary plate B is formed of glass, and the like.

The respective structures of the X-ray orientation measuring device 76 for measuring the crystal orientations of the work 22, the orientation adjust device 77 for adjusting the crystal orientation of the work 22 in the rotational direction thereof, and the marking device 78 for putting the marks M1 and M2 on the work 22 can be changed properly.

In the support base 40, the structure of the orientation adjust mechanism 44 for adjusting the crystal orientation of the work 22 in the horizontal direction thereof can be changed properly.

Thanks to the above-mentioned structure, the present invention can provide the following effects.

That is, according to the invention, prior to mounting of the work onto the work support mechanism of the wire saw, the crystal orientations of the work in the rotational direction and in the horizontal direction thereof can be previously adjusted, which makes it possible not only to simplify the structure of the wire saw but also to enhance the working efficiency. Also, since a plurality of works can be easily mounted on the work support mechanism, the plurality of works can be worked at the same time, thereby being able to improve the productivity.

Further, the auxiliary plate can be adhered to the outer peripheral surface of the work with accuracy based on the marks put on the end face and outer peripheral surface of the work.

Still further, the crystal orientations of the work in the rotational direction and in the horizontal direction thereof can be measured easily and accurately by the X-ray orientation measuring device.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

What is claimed is:

1. A work crystal orientation adjusting method which is conducted before a work to be cut is mounted onto a work support mechanism in a wire saw, said work crystal orientation adjusting method comprising the steps of:

measuring crystal orientations of said work having a crystal structure in a rotational direction and a horizontal direction of said work;

rotating said work around a center axis thereof in accordance with thus measured value of said crystal orientation of said work in said rotational direction so as to adjust said crystal orientation of said work in said rotational direction;

providing marks, which respectively indicate reference positions of said work, on an outer surface of said work thus adjusted in the rotational direction of said work;

adhering an auxiliary plate to an outer peripheral surface of said work on which said marks have been provided while said auxiliary plate is positioned relative to said work on the basis of said marks and also is positioned in parallel to said center axis of said work;

mounting said auxiliary plate, on which said work has been adhered, onto an orientation adjust mechanism which is disposed on a support base member being attachable to said work support mechanism, in said wire saw;

shifting said center axis of said work mounted on said auxiliary plate in a horizontal plane relative to said support base member in accordance with the measured value of said crystal orientation of said work in said horizontal direction so as to thereby adjust said crystal orientation of said work in said horizontal direction after said crystal orientation of said work has been adjusted in the rotational direction; and attaching said support base member to said work support mechanism after said crystal orientations of said work in said rotational and horizontal directions have been adjusted, wherein said marks each consists of two parallel lines spaced apart by a distance corresponding to the width of said auxiliary plate.

2. The work crystal orientation adjusting method as set forth in claim 1, wherein said marks indicating said reference positions in said rotational direction are respectively put on the end face of said work and on the outer peripheral surface of said work.

3. The work crystal orientation adjusting method as set forth in claim 1, wherein said measurement of said work crystal orientations is carried out by an X-ray orientation measuring device.

4. The work crystal orientation adjusting method as set forth in claim 2, wherein said measurement of said work crystal orientations is carried out by an X-ray orientation measuring device.

5. The work crystal orientation adjusting method as set forth in claim 1, wherein said marks are put while said work is being carried into or out of a crystal orientation measuring position.

6. The work crystal orientation adjusting method as set forth in claim 2, wherein said marks are put while said work is being carried into or out of a crystal orientation measuring position.

7. The work crystal orientation adjusting method as set forth in claim 3 wherein said marks are put while said work is being carried into or out of a crystal orientation measuring position.

8. The work crystal orientation adjusting method as set forth in claim 4, wherein said marks are put while said work is being carried into or out of a crystal orientation measuring position.

9. The work crystal orientation adjusting method as set forth in claim 1, wherein a horizontal-direction crystal orientation of said work on which said auxiliary plate is adhered is adjusted while said work is supported on said support plate.

10. A work crystal orientation adjusting apparatus for a wire saw with a work support mechanism, said apparatus comprising:

means for measuring crystal orientations of a work having a crystal structure in a rotational direction and a horizontal direction of said work;

means for rotating said work around a center axis thereof in accordance with the measured value of said crystal orientation of said work in said rotational direction so as to adjust said crystal orientation of said work in said rotational direction;

means for providing marks, which respectively indicate reference positions of said work, on an outer surface of said work;

means for adhering an auxiliary plate to an outer peripheral surface of said work on which said marks have been provided while said auxiliary plate is positioned relative to said work on the basis of said marks and also is positioned in parallel to said center axis of said work;

a horizontal-direction orientation adjust mechanism, disposed on a support base member being attachable to said work support mechanism in said wire saw, for shifting said center axis of said work in a horizontal plane relative to said support base member in accordance with the measured value of said crystal orientation of said work in said horizontal direction so as to thereby adjust said crystal orientation of said work in said horizontal direction after said crystal orientation of said work has been adjusted in the rotational direction; and means for attaching said support base to said work support mechanism after said crystal orientations of said work in said rotational and horizontal directions have been adjusted, wherein said marks each consists of two parallel lines spaced apart by a distance corresponding to the width of said auxilliary plate.

11. The work crystal orientation adjusting apparatus as set forth in claim 10, wherein said marks indicating said reference positions in said rotational direction are respectively put on the axially end face of said work and on the outer peripheral surface of said work.

12. The work crystal orientation adjusting apparatus as set forth in claim 10, wherein said crystal orientations measuring means comprises an X-ray orientation measuring device.

13. The work crystal orientation adjusting apparatus as set forth in claim 11, wherein said crystal orientations measuring means comprises an X-ray orientation measuring device.

14. The work crystal orientation adjusting apparatus as set forth in claim 10, in which a plurality of said horizontal-direction orientation adjust mechanisms are disposed on said support base member in such a manner that a plurality of works can be simultaneously cut.

15. The work crystal orientation adjusting apparatus as set forth in claim 10, in which said work support mechanism includes a plurality of said support base members each having said horizontal-direction orientation adjust mechanism.

16. The work crystal orientation adjusting apparatus as set forth in claim 10, in which said means for providing marks comprises:

at least one marker; and means for moving said work between a measuring position of said crystal orientations measuring means and a carry-in/out position which is located outwardly of said measuring position.

17. The work crystal orientation adjusting apparatus as set forth in claim 11, in which said means for providing marks comprises:

at least one marker;

means for moving said marker; and means for moving said work between a measuring position of said crystal orientations measuring means and a carry-in/out position which is located outwardly of said measuring position.

18. A work crystal orientation adjusting apparatus for a wire saw with a work support mechanism, said apparatus comprising:

a measuring device which measures crystal orientations of a work having a crystal structure in a rotational direction and in a horizontal direction of said work;

a rotator which rotates said work around a center axis thereof in accordance with the measured value of said crystal orientation of said work in said rotational direction so as to adjust said crystal orientation of said work in said rotational direction;

a marker which provides marks, which respectively indicate reference positions of said work, on an outer surface of said work;

a structure which adheres an auxiliary plate to an outer peripheral surface of said work on which said marks have been provided while said auxiliary plate is positioned relative to said work on the basis of said marks and also is positioned in parallel to said center axis of said work;

a horizontal-direction orientation adjust mechanism, disposed on a support base member being attachable to said work support mechanism in said wire saw, for shifting said center axis of said work in a horizontal plane relative to said support base member in accordance with the measured value of said crystal orientation of said work in said horizontal direction so as to thereby adjust said crystal orientation of said work in said horizontal direction after said crystal orientation of said work has been adjusted in the rotational direction; and a structure which attaches said support base to said work support mechanism after said crystal orientations of said work in said rotational and horizontal directions have been adjusted, wherein said marks each consists of two parallel lines spaced apart by a distance corresponding to the width of said auxiliary plate.

* * * * *